United States Patent [19]

Eden

[11] Patent Number: 5,244,712
[45] Date of Patent: Sep. 14, 1993

[54] LAMINATED DIAMOND SUBSTRATE

[75] Inventor: Richard C. Eden, Thousand Oaks, Calif.

[73] Assignee: Norton Company, Worcester, Mass.

[21] Appl. No.: 642,244

[22] Filed: Jan. 15, 1991

[51] Int. Cl.$^5$ .............................................. B32B 33/00
[52] U.S. Cl. .................................... 428/142; 428/141; 428/161; 428/403; 428/407; 428/323; 428/426; 428/411.1
[58] Field of Search ................. 428/408, 57, 141, 142, 428/161, 403, 407, 457, 426, 411.1, 323; 156/297, DIG. 68

[56] References Cited

FOREIGN PATENT DOCUMENTS 0379773 1/1990 European Pat. Off. .
61-145266 7/1986 Japan .

OTHER PUBLICATIONS

Ravi et al "Silicon On Insulator Technology Using CVC Diamond Films" Proc. Electrochem Soc pp. 24-37, Dec. 1989.

Primary Examiner—Ellis P. Robinson
Assistant Examiner—A. A. Turner
Attorney, Agent, or Firm—Volker R. Ulbrich

[57] ABSTRACT

A synthetic diamond wafer grown by deposition from a plasma has a smooth, substrate side face and a rough, deposition side face. The rough face is coated with a bonding agent which fills the valleys and is finished so that its surface is parallel to the substrate side face to permit photolithographic processing of the wafer. Also disclosed is a multi-wafer laminate of two or more diamond film layers bonded together with an interlayer. Smooth, flat outer faces of the layers are oriented mutually parallel. The inner, bonded faces may be rough. A filler of diamond particles in the bonding agent improves the thermal conductivity of the laminate.

8 Claims, 1 Drawing Sheet

LAMINATED DIAMOND SUBSTRATE

FIELD OF THE INVENTION

The invention relates to heat conducting substrates, particularly those for electronic circuits.

BACKGROUND OF THE INVENTION

In recent years it has become feasible to manufacture diamond films of sufficient thickness to permit the manufacture of a diamond film wafer for use as a base material for electronic circuits, either as a direct electrical substrate for devices or as a circuit board on which circuit devices or chips such as VLSI (very large scale integrated) circuits are mounted. Primarily two characteristics of diamond material make it especially suited for such purposes. While on the one hand, it is an excellent electrical insulator, at the same time it is also a superb heat conductor, with a heat conductivity about 5 times that of copper. The presently available methods of forming diamond wafers by deposition from a plasma, however, typically result in a structure which may be flat on one face as a result of being deposited on a flat and smooth deposition substrate, but nevertheless will have an uneven and rough opposite face on the side where deposition took place. Such unevenness is a serious problem for any semiconductor manufacturing applications, which generally involve at least one photolithography step requiring the substrate to have substantially parallel and flat opposing faces, the required degree of parallelism depending upon the depth of field of the photolithographic equipment used. Smoothing the uneven face of a diamond film wafer is a costly finishing process involving grinding with diamond abrasive.

SUMMARY OF THE INVENTION

In accordance with the present invention, a rough face of a diamond wafer surface has a layer of bonding agent applied to it. The bonding agent layer is thick enough to fill valleys in the surface, but thin enough also to minimize any degrading of the desirable heat conducting properties of the diamond wafer material. The coating can be finished to bring its surface into parallel alignment with the opposite face.

In other embodiments of the invention, two diamond film wafers have their rough surfaces bonded together, so that their opposite, outside surfaces are mutually parallel. The resulting structure has nearly the characteristics of a single diamond film wafer, while nevertheless having parallel and smooth faces without the necessity of finishing the surfaces.

DETAILED DESCRIPTION

Figure 1:
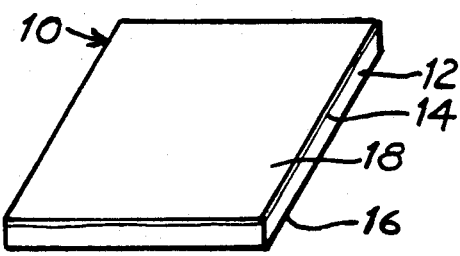
FIG. 1 is an schematic, isometric view of a diamond substrate in accordance with one embodiment of the present invention in which a major face of a diamond wafer is modified with a bonding agent.
Figure 2:
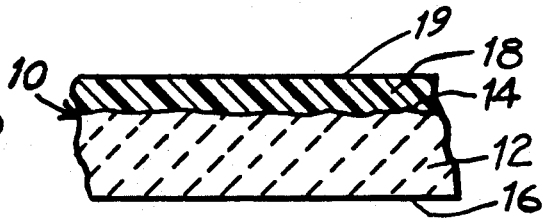
FIG. 2 is a schematic cross-sectional view of a fragment of the substrate of FIG. 1 showing the structure in more detail.

The FIGS. 1 and 2 show a rectangular substrate 10 constructed of a diamond wafer 12 about 1 millimeter (mm) thick having a rough face 14 on the side on which crystal deposition took place and an opposite, smooth face 16 which was in contact with a smooth and flat deposition substrate surface during the growth process. The diamond film wafer 12 may be fabricated by any of various present known techniques for diamond deposition, such as by arc-assisted plasma deposition. Present deposition techniques generally result in a somewhat nonuniform thickness and a rough surface on the deposition side of the film. However, by depositing the film on a smooth substrate, at least the face of the wafer 12 which lies on the substrate can be made flat and relatively smooth. The wafer 12 is polycrystalline material having diamond microcrystals which are directly bonded to each other. The thickness of a wafer typically may vary by as much as a factor of three. The thickness of the wafer 12 is chosen to suit the application requirements for thermal conductivity and ruggedness.

The rough face 14 is covered with a thin coating 18 of a suitable filler material, such as an epoxy bonding agent, which after hardening is surface-finished to make its exposed surface 19 smooth and in substantially parallel alignment with the smooth face 16. The thickness of the coating 18 need only be enough to fill in any valleys for barely covering the highest points of the rough face 14 and to permit enough finishing of the surface to achieve parallel alignment of the surface 19 with the face 16. Since the quality of the rough face 14 of a deposited wafer varies somewhat with the deposition conditions, the minimum thickness of the coating 18 for a given wafer also varies, but can be readily determined by taking into consideration the final surface condition of the deposited wafer 12. In general, it should be at least as thick at its thickest point as the difference between the thickest and thinnest features of the wafer 12.

The coating 18 may be any of numerous known bonding agents from which one skilled in the art can readily select an appropriate choice to suit the particular characteristics required. Organic resin coatings may be used where the finished substrate is not exposed to high temperatures. A glass coating can be used by applying glass frit and melting it on the surface. The glass can then be optically polished and dimensioned. A metal coating applied, for example, by evaporation, chemical vapor deposition, electroless plating, or in the form of a braze can be used where the one face can be electrically conductive. The coating may also be a composite, such as diamond grit held in a binder. With such a coating, it may be possible to obtain a higher thermal conductivity for the resulting substrate 10.

The coating 18 is likely to have a higher coefficient of thermal expansion (CTE) than the diamond wafer 12. In that case, there will be a tendency for the substrate 10 to bend with change in temperature. This can be minimized by making the coating 18 thin and with a relatively low elastic modulus, i.e. resilient, or with a tendency to creep or cold flow. The coating material must also be compatible with intended processing steps for the substrate 10. Where the substrate 10 is to be used as an electronic device substrate, this would probably include such steps as laser cutting and drilling of via holes and the metallization of conductor paths, both on the surfaces and inside the via holes.

Figure 3:
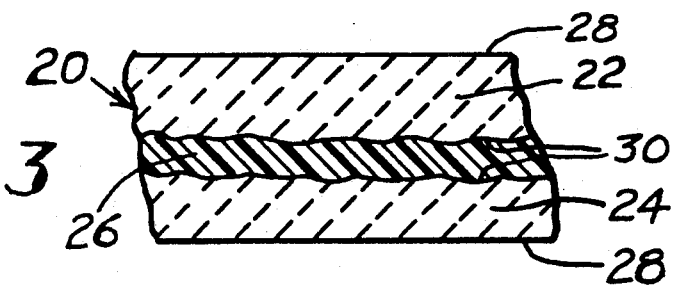
FIG. 3 is a schematic, cross-sectional view of a fragment of a substrate in accordance with another embodiment of the invention in which two wafers are laminated together by means of a bonding agent.

The FIG. 3 shows a multi-wafer laminated substrate 20 constructed of an upper diamond film wafer 22 and a lower diamond film wafer 24, which are bonded together by an interface layer 26. Each of the diamond wafers 22,24 have an outer smooth face 28 and an inner, rough face 30. The wafers 22,24 each have a thickness of about 1.0 mm. The interface layer 26 is a bonding agent chosen with much the same considerations as is the material of the coating of the first embodiment of the invention discussed above, but in this case is exposed to the ambient gases only at the perimeter. It also is not as likely to result in bending of the substrate 20, since in this structure there is symmetry for any bending moment stresses which would result from thermal changes.

Figure 4:
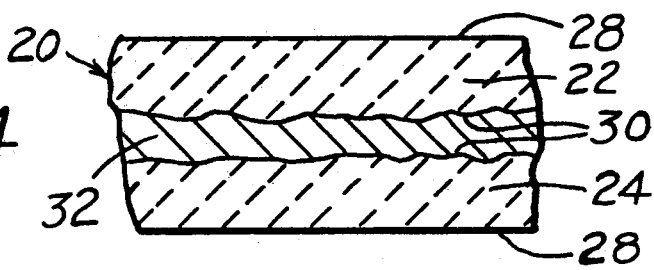
FIG. 4 is a schematic cross-sectional view of a fragment of another embodiment of the invention involving the use of a metal bonding agent.
Figure 5:
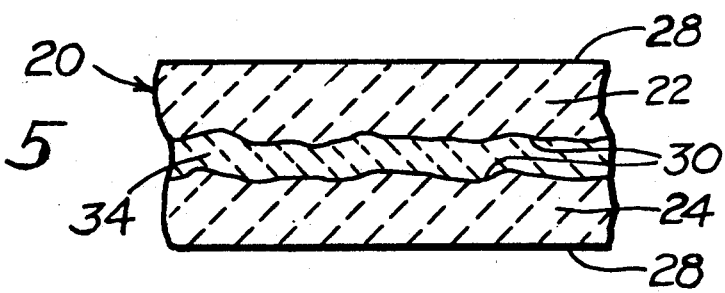
FIG. 5 is a schematic cross-sectional view of a fragment of another embodiment of the invention involving the use of a glass bonding agent.
Figure 6:
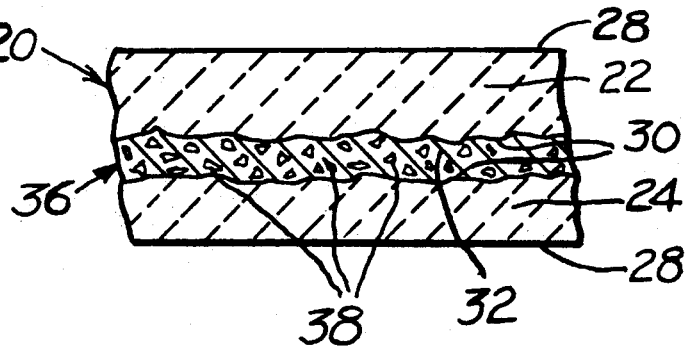
FIG. 6 is a schematic cross-sectional view of a fragment of another embodiment of the invention involving the use of a composite bonding agent.

The bonding process is accomplished by, for example, holding the wafers 22,24 in a jig which orients the outer faces 28 in a mutually parallel relationship while the interface layer 26 is setting. The interface layer 26 may be of various materials chosen to suit the desired application conditions. For example, the layer 26 may be a metal braze 32, as is shown in FIG. 4 or a glass layer 34, as is shown in FIG. 5. The glass layer 34 may be formed by the application of a glass frit between the layers 22,24 and subsequent heating to melt the frit. If the thermal conductivity of the substrate 20 is a critical parameter, the bonding agent used for the interface layer may be a composite interlayer 36 loaded with diamond particles 38, as is shown in FIG. 6. The thermal conductivity of the resulting substrate 10 is in any case maximized by reducing the thickness of the interface layer 26 to a minimum, since that layer 26 will always have a lower thermal conductivity than the diamond material of the wafers 22,24. It is important to prevent the formation of voids in the bonding agent, since these would behave as thermal insulating material. The mechanical integrity of the multi-wafer laminated structure as discussed above is substantially less subject to degradation as a result of cracks which might be present in a wafer.

While the substrate 20 is made with two diamond film layers, it will be readily apparent to those skilled in the art that more layers could be added as desired. For instance, an intermediate diamond film wafer could be added to increase the thickness and thermal conductivity. The intermediate layer would not need to have a smooth face on either side.

For practical applications of the novel substrate involving electronic devices, it may be necessary to perform an etching, abrading, or other cleaning process on one or both exposed faces to remove any residual graphite which would make the surface excessively conductive.

What is claimed is:

1. A multi-wafer diamond laminate member, comprising first and second diamond film wafers, each having a first, relatively smooth and flat face and a second face, the second face of the first wafer being bonded to the second face of the second wafer by means of an interlayer which includes a bonding agent thick enough to fill valleys in the second faces.

2. The member according to claim 1, the flat first faces of the first and second wafers being oriented substantially mutually parallel.

3. The member according to claim 2, wherein said second face of at least said first wafer is significantly less smooth than said first face.

4. The member of claim 3, wherein said interlayer comprises a filler of fine particles.

5. The member according to claim 4, wherein the particles have a lower coefficient of thermal expansion than does the bonding agent.

6. The member of claim 5, wherein said particles are diamond.

7. The member of claim 6, wherein the bonding agent is an organic resin.

8. The member of claim 6, wherein said bonding agent is glass.

* * * * *